United States Patent
Matsuura et al.

(10) Patent No.: US 9,721,838 B2
(45) Date of Patent: Aug. 1, 2017

(54) PRODUCTION METHOD FOR SEMICONDUCTOR ELEMENT, AND SEMICONDUCTOR ELEMENT

(71) Applicant: SHARP KABUSHIKI KAISHA, Osaka-shi, Osaka (JP)

(72) Inventors: Fumiaki Matsuura, Osaka (JP); Tomotoshi Satoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/032,907

(22) PCT Filed: Oct. 24, 2014

(86) PCT No.: PCT/JP2014/078353
§ 371 (c)(1),
(2) Date: Apr. 28, 2016

(87) PCT Pub. No.: WO2015/068597
PCT Pub. Date: May 14, 2015

(65) Prior Publication Data
US 2016/0268167 A1 Sep. 15, 2016

(30) Foreign Application Priority Data
Nov. 6, 2013 (JP) .................. 2013-230314

(51) Int. Cl.
*H01L 21/8258* (2006.01)
*H01L 21/78* (2006.01)
(Continued)

(52) U.S. Cl.
CPC .......... *H01L 21/78* (2013.01); *H01L 21/4825* (2013.01); *H01L 21/6836* (2013.01);
(Continued)

(58) Field of Classification Search
CPC .................................................. H01L 21/8258
(Continued)

(56) References Cited

U.S. PATENT DOCUMENTS

| 5,429,954 A * | 7/1995 | Gerner ................... H01L 33/22 257/13 |
| 8,435,869 B2 * | 5/2013 | Hironaka .............. H01S 5/0202 257/E21.596 |

(Continued)

FOREIGN PATENT DOCUMENTS

| JP | 2003-197564 | 7/2003 |
| JP | 2005-12206 | 1/2005 |

(Continued)

OTHER PUBLICATIONS

JP Office Action mailed Sep. 27, 2016 in JP application 2015-546604.
(Continued)

*Primary Examiner* — George Fourson, III
(74) *Attorney, Agent, or Firm* — Nixon & Vanderhye P.C.

(57) ABSTRACT

A production method for a semiconductor element (10) includes: a semiconductor element forming step of forming the semiconductor element (10) including a dielectric film (3); a dicing region forming step of forming dicing regions (11) by removing the dielectric film (3) in partition regions that partition the semiconductor element (10); and a dicing step of dicing the dicing regions (11).

5 Claims, 9 Drawing Sheets

(51) Int. Cl.
*H01L 21/48* (2006.01)
*H01L 29/20* (2006.01)
*H01L 21/683* (2006.01)
*H01L 23/495* (2006.01)
*H01L 23/544* (2006.01)

(52) U.S. Cl.
CPC ...... *H01L 29/2003* (2013.01); *H01L 21/8258* (2013.01); *H01L 23/49513* (2013.01); *H01L 23/544* (2013.01); *H01L 2221/6834* (2013.01); *H01L 2221/68327* (2013.01); *H01L 2221/68386* (2013.01); *H01L 2223/54433* (2013.01); *H01L 2223/54453* (2013.01); *H01L 2223/54486* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/48465* (2013.01); *H01L 2224/73265* (2013.01); *H01L 2224/83192* (2013.01); *H01L 2924/181* (2013.01)

(58) Field of Classification Search
USPC .......................................................... 438/465
See application file for complete search history.

(56) References Cited

U.S. PATENT DOCUMENTS

| | | | | |
|---|---|---|---|---|
| 8,778,806 B2* | 7/2014 | Johnson | .............. | H01L 21/3065 438/113 |
| 8,871,614 B2* | 10/2014 | Kim | .................... | H01L 23/3178 438/113 |
| 9,087,854 B1* | 7/2015 | Ha | .................... | H01L 29/66431 |
| 9,257,342 B2* | 2/2016 | Stranzl | .................... | H01L 21/78 |
| 2008/0056319 A1 | 3/2008 | Ohno | | |
| 2014/0307997 A1* | 10/2014 | Bar | ..................... | H01L 21/8258 385/14 |
| 2014/0367695 A1* | 12/2014 | Barlow | ............... | H01L 29/1029 257/76 |
| 2016/0035828 A1* | 2/2016 | Mizuhara | ................ | H01L 21/78 257/620 |
| 2016/0204074 A1* | 7/2016 | Lin | ....................... | H01L 21/784 257/76 |

FOREIGN PATENT DOCUMENTS

| | | |
|---|---|---|
| JP | 2008-60478 | 3/2008 |
| JP | 2008-130929 A | 6/2008 |
| JP | 2013-102192 | 5/2013 |
| JP | 2013-219271 A | 10/2013 |

OTHER PUBLICATIONS

International Search Report for PCT/JP2014/078353, mailed Jan. 20, 2015, 4 pages.

Ubukata et al., "Development of production-scale MOCVD system for GaN power devices on Si substrates", Taiyo Nippon Sanso Technical Report, 2011, No. 30, pp. 23-28, partial translation.

Ueda, "The current situation of GaN power devices and applications thereof", KEC Information, Jan. 2013, No. 224, pp. 35-38, partial translation.

* cited by examiner

100: SEMICONDUCTOR DEVICE
111: SEMICONDUCTOR CHIP
112: ISLAND
113: PASTE
115: BONDING PAD
116: LEAD
117: WIRE
121: PACKAGE

6a: GROOVE
20: SURFACE CHIPPING
21: INTERLAYER CRACK
101: SEMICONDUCTOR WAFER

1: SILICON-BASED SUBSTRATE
2: GaN-BASED SEMICONDUCTOR FILM
3: DIELECTRIC FILM
5: PROTECTIVE FILM
6a: GROOVE
6b: END PORTION
21: INTERLAYER CRACK
101: SEMICONDUCTOR WAFER

PRODUCTION METHOD FOR SEMICONDUCTOR ELEMENT, AND SEMICONDUCTOR ELEMENT

This application is the U.S. national phase of International Application No. PCT/JP2014/078353 filed 24 Oct. 2014, which designated the U.S. and claims priority to JP Patent Application No. 2013-230314 filed 6 Nov. 2013, the entire contents of each of which are hereby incorporated by reference.

TECHNICAL FIELD

The present invention relates to a production method for a semiconductor element and the semiconductor element.

BACKGROUND ART

In recent years, a power device that has a high breakdown voltage characteristic and is used to allow a large current to flow has been actively developed. In the development of such a power device, a nitride semiconductor that is made of a material, which has a high insulation breakdown electric field and a high saturation electron velocity, has attracted attention. The power device using a GaN (gallium nitride)-based semiconductor among the nitride semiconductors, as disclosed in NPL 1 and NPL 2, has been expected to greatly contribute to energy saving in future low-loss and high-speed power switching systems.

However, in the production of a GaN power device, when blade dicing, which is normally used for dicing the silicon semiconductor wafer, is performed, since a GaN film is hard, it is difficult to separate the semiconductor wafer successfully. In addition, due to the difference in lattice constants and thermal expansion coefficients between a silicon substrate and the GaN film, in the semiconductor wafer, a large amount of stress occurs in the vicinity of the interface between the silicon-based substrate and the GaN film. In this state, when the mechanical impact of the dicing is applied to the vicinity of the interface, there is a problem that a crack or the like starts from the vicinity of the interface. Therefore, in the production of the GaN power device, laser dicing is used in many cases.

CITATION LIST

Patent Literature

PTL 1: Japanese Unexamined Patent Application Publication No. 2005-12206 (published on Jan. 13, 2005)

Non Patent Literature

NPL 1: "The current situation of GaN power devices and applications thereof" by Tetsuzo Ueda, KEC Information, January 2013, No. 224, p. 35-38

NPL 2: "Development of MOCVD system for power devices on Si substrate" by Akinori Ubukata and five others, Taiyo Nippon Sanso Technical Report, 2011, No. 30, p. 23-28

SUMMARY OF INVENTION

Technical Problem

However, in the laser dicing, debris (evaporated residue) is generated. This leads to a need of removing the debris or an increase in dicing time, and thus there is a problem of increasing costs in dicing. Furthermore, there is a problem that the side of the chip is in a conductive state when the laser dicing is performed, and thus a leak path is formed.

In order to solve the above-described problem in the laser dicing, there is a method of dicing in which dicing is performed after removing the GaN film by etching. For example, PTL 1 discloses a production method for a nitride-based semiconductor element by which recesses for electrodes and partition grooves are formed on a laminated body, which is made of the nitride-based semiconductor, before dicing the semiconductor wafer. In general, since the GaN is a chemically stable material, the GaN film does not dissolve in general acids (hydrochloric acid, sulfuric acid, nitric acid, or the like) and bases, and is not able to be etched by any solution at a room temperature. Therefore, in PTL 1, it is preferable that a dry etching by reactive ion etching be used for etching the GaN film.

However, since the etching speed of the dry etching is slow, there is a problem of decreasing productivity.

The present invention has been made in order to solve the above-described problem, and an object thereof is to provide a production method for a GaN-based semiconductor element that is capable of reducing cracks that occur in the vicinity of the interface between the substrate and the GaN-based semiconductor film during the dicing.

Solution to Problem

In order to solve the above-described problem, a production method for a semiconductor element according to an aspect of the present invention includes: a semiconductor element forming step of forming a plurality of semiconductor elements by forming a dielectric film on a GaN-based semiconductor film formed on a substrate; a dicing region forming step of forming groove-shaped dicing regions by removing the dielectric film in partition regions that partition the plurality of semiconductor elements; and a dicing step of separating the plurality of semiconductor elements from each other by dicing the dicing regions.

A semiconductor element according to another aspect of the present invention is a semiconductor element that is separated from a semiconductor wafer, the semiconductor element including: a GaN-based semiconductor film formed on a substrate; and a dielectric film formed on the GaN-based semiconductor film. The semiconductor element is separated from the semiconductor wafer by dicing dicing regions from which the dielectric film is removed.

Advantageous Effects of Invention

According to the aspects of the present invention, it is possible to exhibit the effect of providing the production method for the GaN-based semiconductor element that is capable of reducing cracks that occur in the vicinity of the interface between the substrate and the GaN-based semiconductor film during the dicing.

BRIEF DESCRIPTION OF DRAWINGS

FIG. 1(a) is an enlarged plan view of a portion of a semiconductor wafer, and FIG. 1(b) illustrates sectional views taken along line A-A of the semiconductor wafer illustrated in FIG. 1(a) in each production step for the semiconductor chip.

FIG. 9(a) is an enlarged plan view of a portion of the semiconductor wafer, FIG. 9(b) illustrates sectional views taken along line C-C of the semiconductor wafer illustrated in FIG. 9(a) in each production step of the semiconductor chip.

DESCRIPTION OF EMBODIMENTS

Hereinafter, embodiments of the present invention will be described.

[First Embodiment]

A production method for a semiconductor chip 111 according to the first embodiment of the present invention will be described based on FIGS. 1 to 8.

(Configuration of Semiconductor Device 100)

Figure 2:
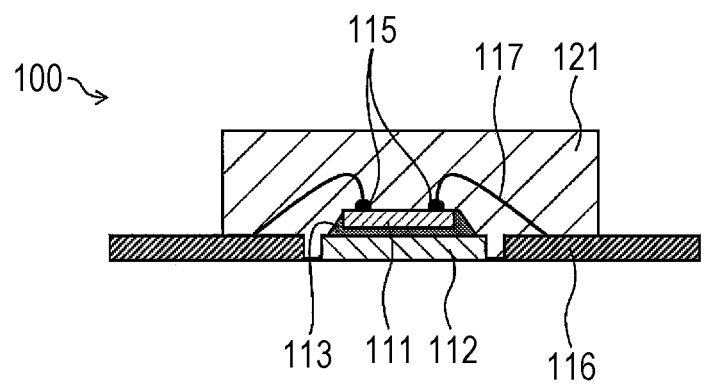
FIG. 2 is a sectional view of a semiconductor device according to the first embodiment of the present invention.

First, a configuration of the semiconductor device 100 including the semiconductor chip 111 will be described. FIG. 2 is a sectional view of the semiconductor device 100 according to the present embodiment. As illustrated in FIG. 2, the semiconductor device 100 includes the semiconductor chip 111 (semiconductor element), an island 112, a paste 113, bonding pads 115, leads 116, wires 117, and a package 121.

The semiconductor chip 111 is mounted on the island 112 via the paste 113. The semiconductor chip 111 and the lead 116 are electrically coupled to each other by the bonding pad 115 and the wire 117.

The semiconductor chip 111 is mounted on the island 112 via the paste 113.

The paste 113 bonds the semiconductor chip 111 to the island 112 such that the semiconductor chip 111 is mounted on the island 112.

The bonding pad 115 is an electrode for electrical connection between the semiconductor chip and the lead 116 or between the semiconductor chip and another semiconductor chip, and is disposed on upper end face of the semiconductor chip 111.

The lead 116 is a terminal that is used for electrical connection between the semiconductor device and external device. The portion of the lead 116 other than the package 121 is coupled to an interconnection substrate or the like on which the semiconductor device 100 is mounted, and the portion of the lead 116 within the package 121 is electrically coupled to the wire 117.

The wire 117 is a connection wire for electrically coupling the semiconductor chip 111 with the lead 116. One end of the wire 117 is coupled to the bonding pad 115, and the other end of the wire 117 is coupled to an upper end face of the lead 116.

The package 121 is a sealing member that covers the semiconductor chip 111, the island 112, the paste 113, the bonding pad 115, the wire 117, and a portion of the lead 116.

Figure 4:
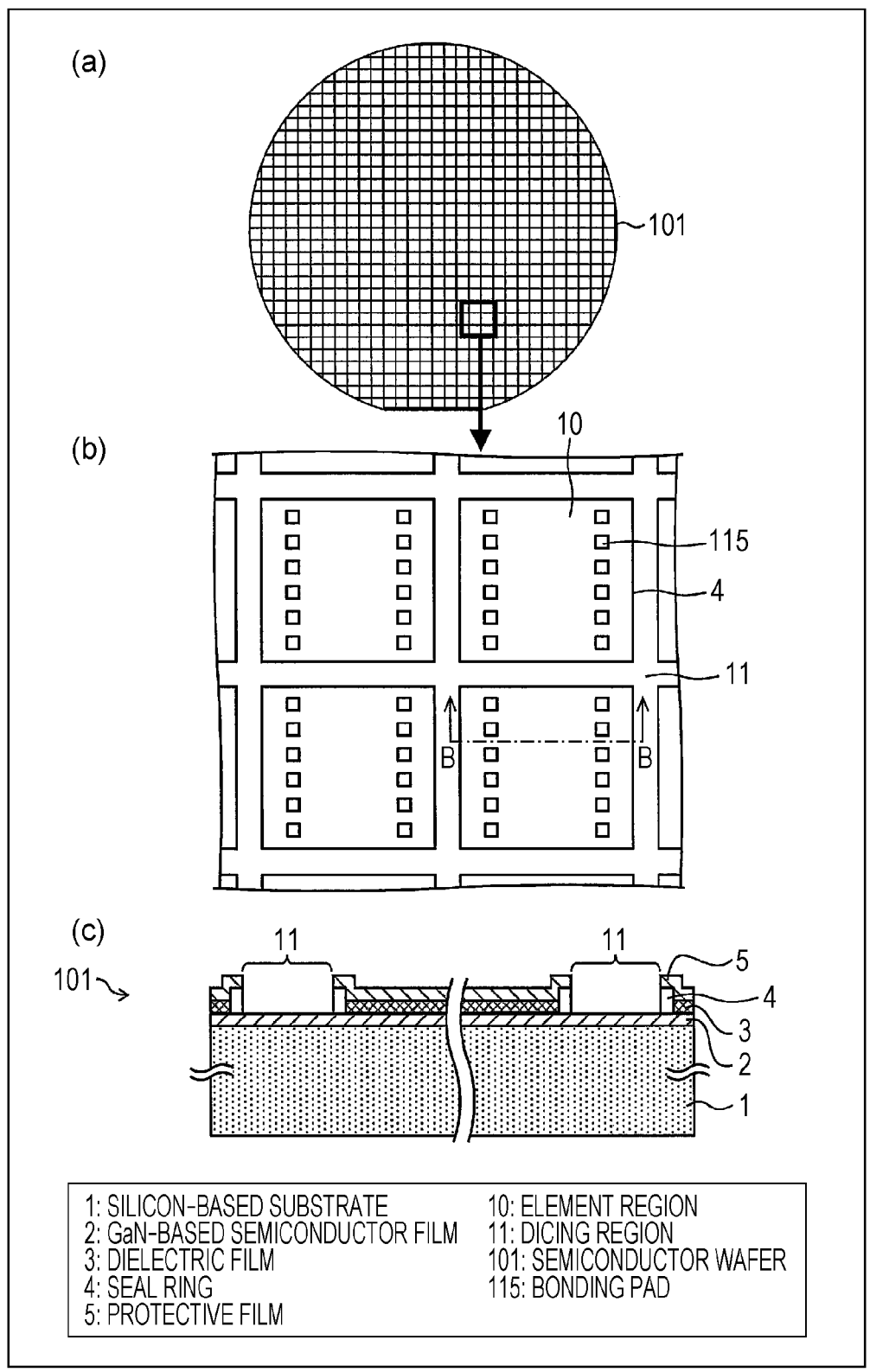
FIG. 4(a) is a plan view illustrating an entire of the semiconductor wafer according to the first embodiment of the present invention.
FIG. 4(b) is an enlarged plan view illustrating a portion of the semiconductor wafer illustrated in FIG. 4(a)
FIG. 4(c) is a sectional view taken along line B-B of the semiconductor wafer illustrated in FIG. 4(b).

Here, the semiconductor chip 111 is a portion that corresponds to an element region 10 taken from a semiconductor wafer 101 (refer to FIG. 4). The details thereof will be described later.

(Outline of Production Method for Semiconductor Device 100)

Outline of the production method for the semiconductor device 100 according to the present embodiment will be described based on FIG. 3, focusing on the contents of each step.

Figure 3:
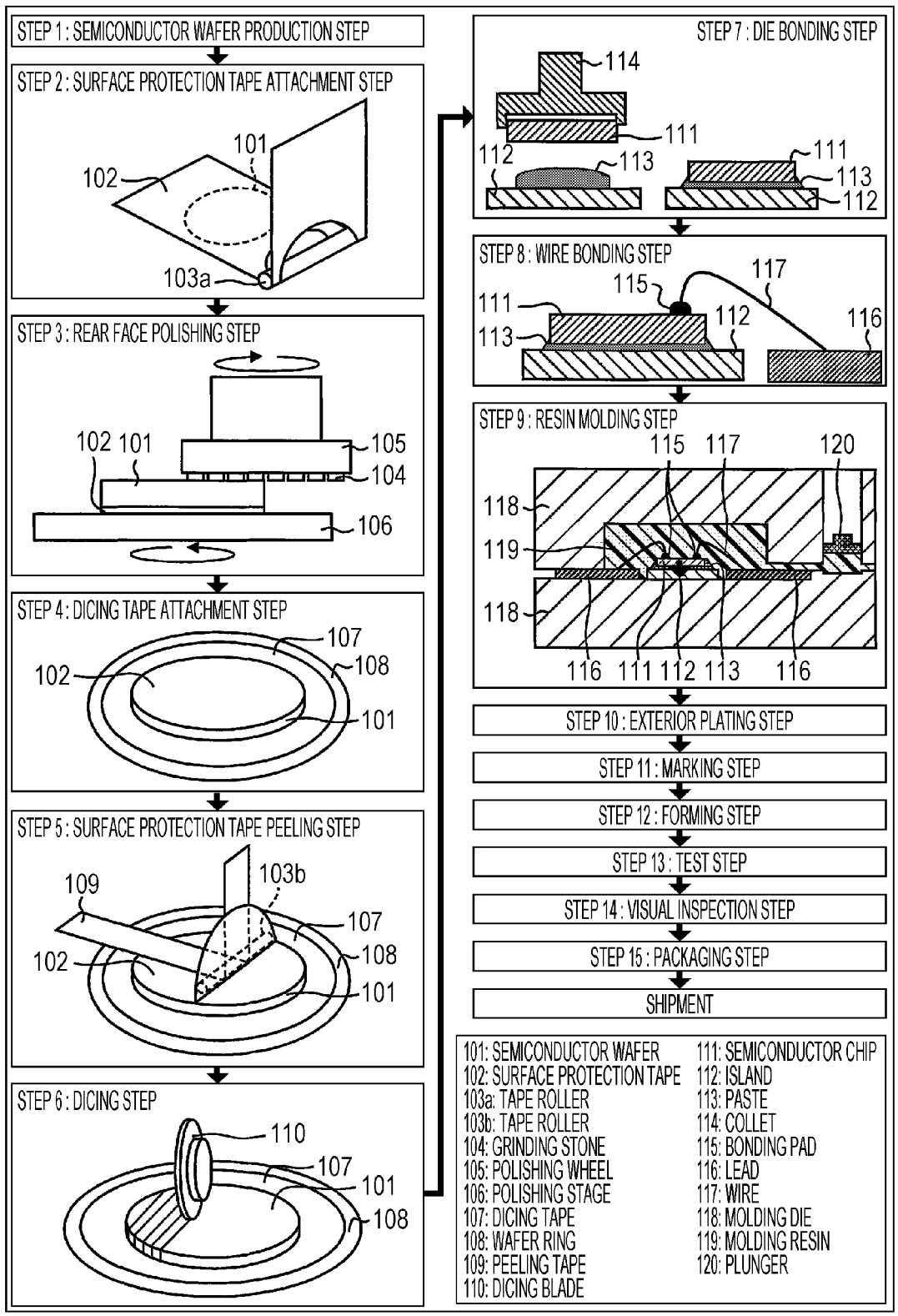
FIG. 3 is a schematic diagram of each production step illustrating a production method for the semiconductor device according to the first embodiment of the present invention.

As illustrated in FIG. 3, the production method for the semiconductor device 100 according to the present embodiment includes a semiconductor wafer production step (step 1), a surface protection tape attachment step (step 2), a rear face polishing step (step 3), a dicing tape attachment step (step 4), a surface protection tape peeling step (step 5), a dicing step (step 6), a die bonding step (step 7), a wire bonding step (step 8), a resin molding step (step 9), an exterior plating step (step 10), a marking step (step 11), a forming step (step 12), a test step (step 13), a visual inspection step (step 14), and a packaging step (step 15).

In the semiconductor wafer production step of step 1, the semiconductor wafer 101 is produced. The configuration and the production of the semiconductor wafer 101 will be described in detail later.

In the surface protection tape attachment step of step 2, in order to protect the surface (circuit portion) of the semiconductor wafer 101 from stress or dirt during performing the rear face polishing in step 3, a surface protection tape 102 is attached to the surface of the semiconductor wafer 101. More specifically, the semiconductor wafer 101 is set under the surface protection tape 102 that moves by a tape roller 103a. The surface of the semiconductor wafer 101 is pressed to the adhesive face of the surface protection tape 102, and thus the surface protection tape 102 is attached to the surface of the semiconductor wafer 101. Then, the surface protection tape 102 is cut in the shape of the semiconductor wafer 101 by using a tape cutter, the unnecessary cut portion of the tape that is cut along the semiconductor wafer 101 is wound and withdrawn.

In the rear face polishing step of step 3, in order to make the semiconductor wafer 101 with a predetermined thickness, the rear face (face to which the surface protection tape 102 is not attached) of the semiconductor wafer 101 is polished. In the rear face polishing step, a polishing wheel 105 and a polishing stage 106 are used as a polishing device. The semiconductor wafer 101 is fixed to the polishing stage 106 with the rear face thereof directed upward. The polishing wheel 105 is placed above the polishing stage 106, and includes grinding stones 104 on the semiconductor wafer 101 side. The rear face of the semiconductor wafer 101 is polished by the grinding stones 104 in a state where the polishing stage 106 and the polishing wheel 105 are rotated, and thus the thickness of the semiconductor wafer 101 is adjusted to the predetermined thickness depending on the type of the package.

In the dicing tape attachment step of step 4, the rear face of the semiconductor wafer 101 is attached to a dicing tape 107 as a preparation for the dicing (separating the semiconductor wafer 101) of step 6. More specifically, the dicing tape 107 is attached to a wafer ring 108, and the semiconductor wafer 101 is attached to the dicing tape 107 inside the wafer ring 108.

In the surface protection tape peeling step of step 5, the surface protection tape 102 is peeled from the semiconductor wafer 101 by using a peeling tape 109. More specifically, the belt-shaped peeling tape 109 that moves by a tape roller 103b is attached to the surface protection tape 102, and then peeled from the semiconductor wafer 101. Thus, the surface protection tape 102 is peeled from the semiconductor wafer 101.

In the dicing step of step 6, the semiconductor wafer 101 is cut (diced) in a predetermined chip size (element region 10: refer to FIG. 4). The semiconductor wafer 101 is cut in longitudinal and transverse directions along dicing regions 11 (scribe lines: refer to FIG. 4) described later by using a dicing blade 110. The semiconductor wafer 101 is diced and divided for each of the element region 10 (refer to FIG. 4), and thus the semiconductor chip 111, that is, the semiconductor element is formed.

In the die bonding step of step 7, the semiconductor chip 111 is placed on the island 112 and mounted on a lead frame (not illustrated). More specifically, the paste 113 is applied on the island 112. Then, the semiconductor chip 111 picked-up by a collet 114 is placed on a predetermined position of the paste 113. The paste 113 is hardened by heat in a state where the semiconductor chip 111 is placed on the predetermined position of the paste 113.

In the wire bonding step of step 8, the semiconductor chip 111 and the lead 116, or the semiconductor chip 111 and another semiconductor chip are electrically coupled to each other. More specifically, the bonding pad 115 and the lead 116 are electrically coupled to each other by the wire 117, and thus the semiconductor chip 111 and the lead 116 are electrically coupled to each other. In the same manner, the bonding pad 115 and the bonding pad 115 formed on another semiconductor chip 111 are electrically coupled to each other by the wire 117, and thus the semiconductor chip 111 and another semiconductor chip 111 are electrically coupled to each other. For example, gold wire, silver wire, copper wire, aluminum wire, or the like can be used as the wire 117.

In the resin molding step of step 9, the semiconductor chip 111, the island 112, the paste 113, the bonding pad 115, the wire 117, and a portion of the lead 116 is coated with molding resin 119, and thus the package 121 is formed. More specifically, the molding resin 119 (plastic resin) is put into a molding die 118 in which a lead frame (not illustrated) is set by using a plunger 120, and then the molding resin 119 is hardened by heat, thereby forming the package 121.

In the exterior plating step of step 10, the molding resin burrs leaked on the outer lead, that is, on the lead 116 that is not coated with the molding resin 119 are removed. Then, the outer lead is subjected to a solder plating process so as to allow a user to mount the semiconductor device 100 on the substrate by soldering.

In the marking step of step 11, required information such as a product name is marked on the surface of the package 121. In the marking of the required information, a technique of printing the required information by using an ink such as a thermosetting ink or a technique of carving the required information on the surface of the package by using laser radiation is used, for example.

In the forming step of step 12, each package is individually separated from the lead frame, and the outer lead is machined in a predetermined shape by using a die.

In the test step of the step 13, it is determined that the produced package is a non-defective product or a defective product in terms of electrical properties by using a tester.

In the visual inspection step of step 14, the final visual state of the produced semiconductor device 100 is checked according to the contents of the inspection standard set. As the visual inspection, for example, a visual inspection by human eyes, a measurement inspection by using an inspection machine, or the like is used.

In the packaging step of step 15, the produced semiconductor device 100 is accommodated in a predetermined packing. Examples of the predetermined packing include a sleeve packing by using a plastic sleeve, a tray packing by using a plastic tray, and a packing with a tape and a reel by using an embossed tape, and the like. In addition, the package is moisture-proof packaged by sealing the packing with an aluminum laminate. The packing is accommodated in a designated case and shipped.

The above-described description is the outline of the required steps in producing the semiconductor device 100. In particular, the production method for the semiconductor chip 111 according to the present embodiment is characterized in steps corresponding to the semiconductor wafer production step of step 1 and the dicing step of step 6. The details thereof will be described later.

(The Configuration of the Semiconductor Wafer 101)

First, the configuration of the semiconductor wafer 101 will be described based on FIG. 4. FIG. 4(a) is a plan view illustrating the entirety of the semiconductor wafer 101, FIG. 4(b) is an enlarged plan view illustrating a portion of the semiconductor wafer 101, and FIG. 4(c) is a sectional view taken along line B-B of semiconductor wafer 101 illustrated in FIG. 4(b).

As illustrated in FIGS. 4(a) and 4(b), the semiconductor wafer 101 has a plurality of element regions 10 (semiconductor element) and dicing regions 11. The dicing regions 11 are disposed in a grid pattern so as to partition the plurality of element regions 10. Each of the element regions 10 is surrounded by a seal ring 4, circuits and the bonding pads 115 are formed inside the seal ring 4.

As illustrated in FIG. 4(c), the semiconductor wafer 101 includes a silicon-based substrate 1, a GaN-based semiconductor film 2, a dielectric film 3, the seal rings 4, a protective film 5, and the dicing regions 11.

The GaN-based semiconductor film 2 is formed on the surface of the silicon-based substrate 1 (substrate). The dielectric film 3 and the seal ring 4 are formed on the GaN-based semiconductor film 2. The dicing region 11 is formed between the facing seal rings 4.

(Semiconductor Wafer 101 in Each of Production Steps of Semiconductor Chip 111)

Figure 1:
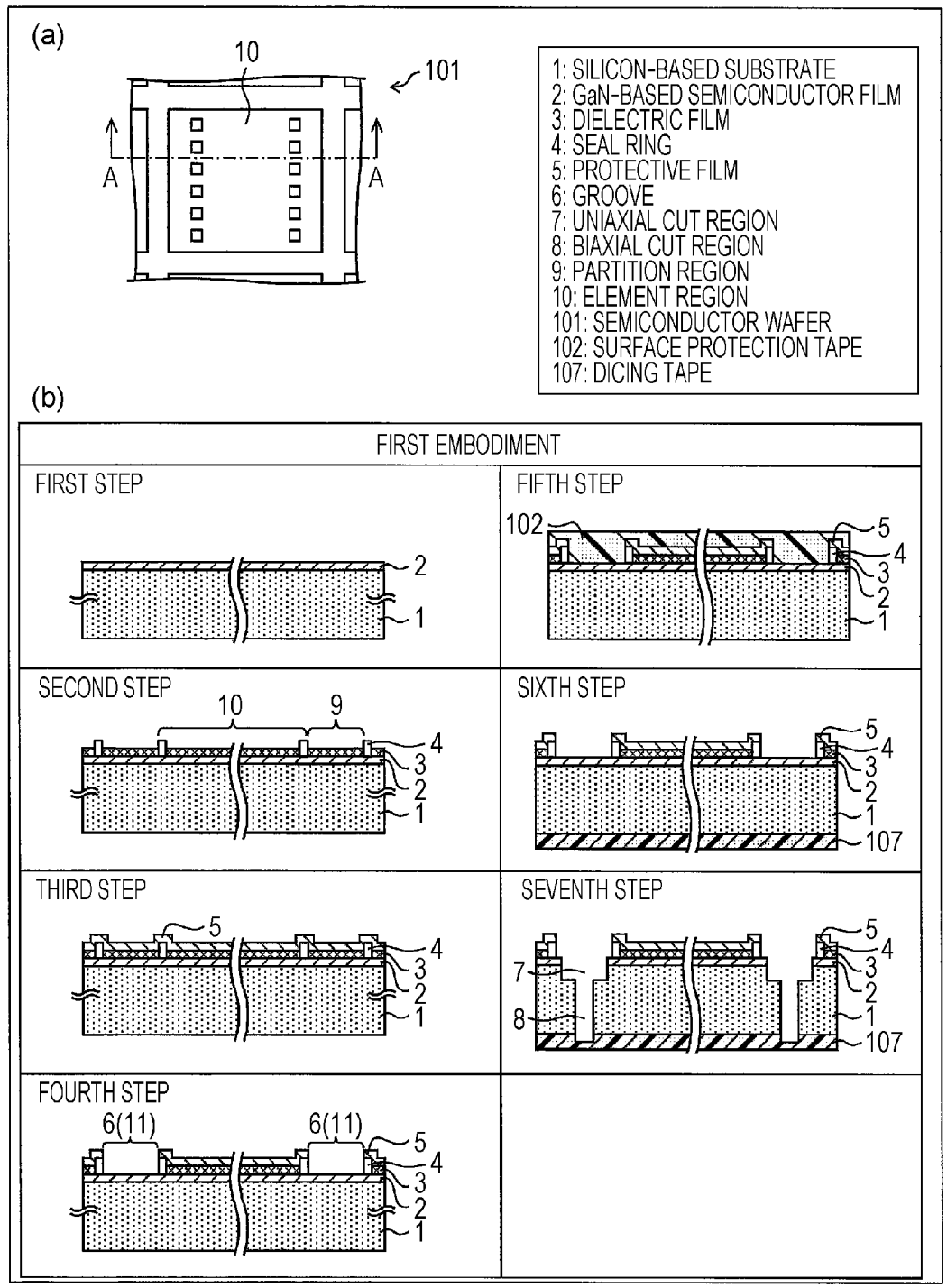
FIG. 1 is a diagram illustrating a production method for a semiconductor chip according to a first embodiment of the present invention.

Next, the semiconductor wafer 101 in each of the production steps of the semiconductor chip 111 will be described based on FIGS. 1(*a*) and 1(*b*). FIGS. 1(*a*) and 1(*b*) are diagrams illustrating production method of the semiconductor chip 111 according to the present embodiment. More specifically, FIG. 1(*a*) is an enlarged plan view of a portion of the semiconductor wafer 101, and FIG. 1(*b*) are sectional views taken along line A-A of the semiconductor wafer 101 illustrated in FIG. 1(*a*) in each of the production steps of the semiconductor chip 111. Here, as described later, the steps of first step to seventh step illustrated in FIG. 1(*b*) correspond to each of the production steps of the production method for the semiconductor device 100.

The steps of first step to fourth step correspond to the semiconductor wafer production step of step 1. Fifth step corresponds to the surface protection tape attachment step of step 2 and the rear face polishing step of step 3. Sixth step corresponds to the dicing tape attachment step of step 4 and the surface protection tape peeling step of step 5. Seventh step corresponds to the dicing step of step 6. Hereinafter, the steps of first step to seventh step will be described.

In the first step, the GaN-based semiconductor film 2 is formed on the silicon-based substrate 1. The thickness and size of the silicon-based substrate 1 is appropriately set, but in the present embodiment, the silicon-based substrate 1 has a thickness of 625 μm and a size of 6 inches.

In the second step (semiconductor element forming step), the dielectric film 3 is formed on the GaN-based semiconductor film 2, and the plurality of the element regions 10 (semiconductor elements) are formed. In addition, circuits are formed on the plurality of the element regions 10. Furthermore, the seal rings 4 are formed in the vicinity of each of the element regions 10 so as to surround the element regions 10. The seal rings 4 are formed to protrude from the dielectric film 3.

In the semiconductor wafer 101, portions other than the element regions 10 that are surrounded by the seal rings 4 become partition regions 9. In other words, in the second step, the partition regions 9 are formed in a lattice pattern so as to partition the semiconductor wafer 101 into the plurality of the element regions 10.

In the third step, the protective film 5 is formed on the dielectric film 3 and the seal ring 4.

In the fourth step (dicing region forming step), grooves 6, that is, the dicing regions 11 are formed by removing the dielectric film 3 and the protective film 5 in the partition regions 9 using etching. More specifically, in the semiconductor wafer 101, masking is performed on the regions other than the partition regions 9. In other words, a mask (not illustrated) is placed at the position of the element region 10. Then, an etching (for example, wet etching) is performed so as to remove the dielectric film 3 and the protective film 5. As a result, since corrosion of the element region 10 at which the mask is placed is suppressed, the element region 10 remains, and the dielectric film 3 and the protective film 5 in the partition region 9 at which the mask is not placed are removed. Thereby, grooves 6, that is, the groove-shaped dicing regions 11 are formed. At this time, in the present embodiment, all of the dielectric film 3 and the protective film 5 in the partition region 9 are removed. The width of the groove 6 is appropriately set, but in the present embodiment, the width of the groove 6 is set to 90 μm.

In the fifth step, in order to protect the surface of the semiconductor wafer 101 from stress or dirt during rear face polishing of the semiconductor wafer 101, the surface protection tape 102 is attached to the surface of the semiconductor wafer 101. In addition, in order to make the semiconductor wafer 101 with a predetermined thickness, the surface of the semiconductor wafer 101 is polished. At this time, since the thermal expansion coefficients or the lattice constants between the silicon-based substrate 1 and the GaN-based semiconductor film 2 are different each other, a large amount of stress occurs in the vicinity of the interface between the silicon-based substrate 1 and the GaN-based semiconductor film 2. For this reason, there is a possibility that the semiconductor wafer 101 breaks into pieces during rear face polishing of the semiconductor wafer 101. Therefore, in order to avoid the risk of breaking semiconductor wafer 101, a WSS (wafer support system) may be used.

In the sixth step, as preparation for the dicing, the semiconductor wafer 101 is attached to the dicing tape 107. In addition, the surface protection tape 102 is peeled from the semiconductor wafer 101 using the peeling tape 109 (refer to FIG. 3). At this time, after peeling off the surface protection tape 102 in advance, the semiconductor wafer 101 is attached to the dicing tape 107, or the like, the order may be reversed.

In the seventh step (dicing step), the semiconductor wafer 101 is cut in a predetermined chip size. By dicing the grooves 6 formed by removing the dielectric film 3 and the protective film 5, that is, the dicing regions 11, it is possible to cut the semiconductor wafer 101. The semiconductor wafer 101 is divided by cutting, thereby forming the semiconductor chip 111.

In the present embodiment, the semiconductor wafer 101 is partitioned into the plurality of element regions 10 by the partition regions 9. Therefore, by dicing the dicing regions 11 formed in the partition regions 9, it is possible to obtain the plurality of the semiconductor chips 111 (semiconductor elements). In addition, by removing the dielectric film 3 and the protective film 5 in the partition region 9, the dicing regions 11 are formed. Therefore, it is possible to cut the semiconductor wafer 101 along the dicing region 11 from which the dielectric film 3 and the protective film 5 are removed, thereby reducing interlayer crack, surface chipping, and film peeling that occur in the vicinity of the interface between silicon-based substrate 1 and GaN-based semiconductor film 2 during dicing the semiconductor wafer 101. Accordingly, it is possible to reduce the interlayer crack and the like without using laser dicing, thereby reducing production costs. Further, it is possible to reduce the interlayer crack and the like without etching the GaN-based semiconductor film 2, thereby shortening production time. As a result, it is possible to improve the yield and productivity in the production of semiconductor chip 111. The reduction in the interlayer crack, the surface chipping, and the film peeling will be described in detail later.

The dicing conditions are assumed to be appropriately set, but in the present embodiment, the dicing conditions are assumed that a blade rotation speed is 30,000 rpm and a cutting speed is 5 mm/s.

The blade dicing method is not particularly limited. However, in a full cut method of cutting the semiconductor wafer 101 by one cut along the cutting lines (the dicing regions 11 in the present embodiment), the load of the dicing blade 110 increases, and the probability of the occurrence of surface chipping or interlayer crack increases. For this reason, the present embodiment employs a step cut method of cutting the semiconductor wafer 101 by cutting in twice using two rotary blades having different thickness.

More specifically, in the step cut method, the dicing blade 110 includes a uniaxial rotary blade (not illustrated) that has a thickness and a biaxial rotary blade (not illustrated) that has a thinner thickness than that of the uniaxial rotary blade. The uniaxial rotary blade cuts the GaN-based semiconductor film 2 at a first cutting. The biaxial rotary blade cuts the silicon-based substrate 1 at a second cutting, and cuts the semiconductor wafer 101. As a result, as illustrated in the seventh step of FIG. 1(b), uniaxial cut regions 7 and biaxial cut regions 8 are formed. According to the configuration, compared to the full cut method of cutting the substrate at once, the step cut method can reduce the load of the dicing blade 110. As a result, the step cut method can further reduce surface chipping, interlayer crack, or film peeling occurring in the vicinity of the interface between the silicon-based substrate 1 and the GaN-based semiconductor film 2 during dicing of semiconductor wafer 101, compared to the full cut method. Further, the step cut method can reduce the load of the dicing blade 110, and thus the clogging of the blade dicing can be suppressed, thereby further reducing the surface chipping 20 or interlayer crack 21.

(Surface Chipping and Interlayer Crack)

Next, the difference in the surface chipping 20 and the interlayer crack 21 that occur after dicing, in the production method for the semiconductor chip 111 according to the present embodiment and a production method for a semiconductor chip in the related art, will be described based on FIGS. 5 to 8. The surface chipping 20 represents a chip on the surface of the semiconductor wafer 101, the interlayer crack 21 represents a crack in the vicinity of the interface between the silicon-based substrate 1 and the GaN-based semiconductor film 2. The surface chipping 20 or the interlayer crack 21 leads to a decrease in yield of semiconductor chip 111.

Figure 5:
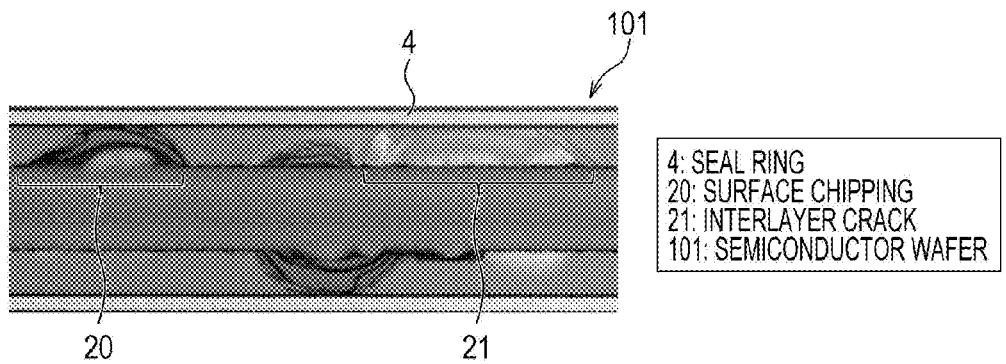
FIG. 5 is a diagram illustrating a surface state of a semiconductor wafer after dicing in a production method for a semiconductor chip in the related art.

FIG. 5 is a diagram illustrating a surface state of semiconductor wafer 101 after dicing in production method for the semiconductor chip in the related art. The production method for the semiconductor chip in the related art represents a production method of dicing the semiconductor wafer 101 by using a blade without etching the dielectric film 3 in the dicing region 11. As illustrated in FIG. 5, in the production method for the semiconductor chip in the related art, the surface chipping 20 and the interlayer crack 21 occur on the semiconductor wafer 101 after dicing. The surface chipping 20 and the interlayer crack 21 that occur are in contact with the seal ring 4. In addition, the interlayer crack 21 that intrudes into the seal ring 4, that is, the element region 10 is also seen.

Figure 6:
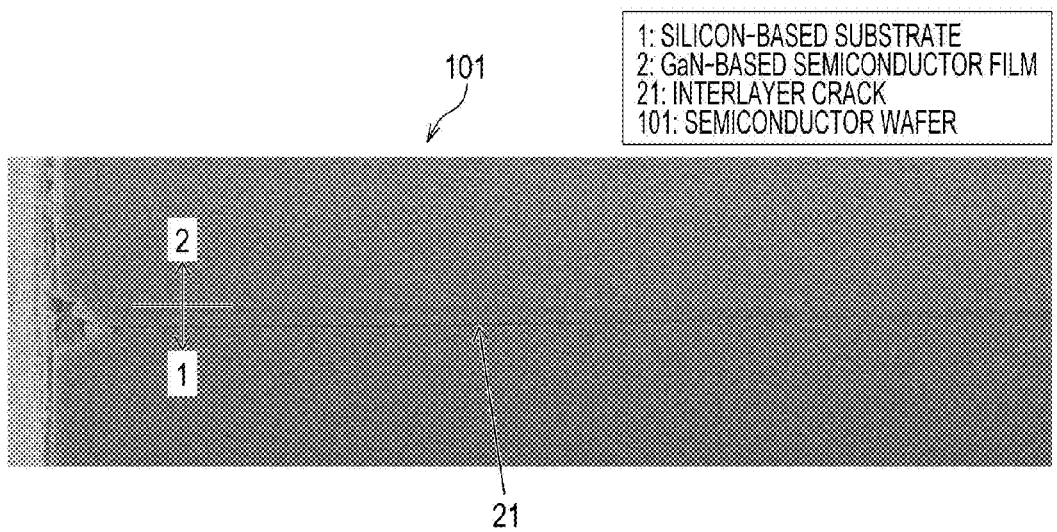
FIG. 6 is a diagram illustrating a sectional state of a semiconductor wafer after dicing in a production method for a semiconductor chip in the related art.

FIG. 6 is a diagram illustrating a sectional state of semiconductor wafer 101 after dicing in the production method for the semiconductor chip in the related art, and a sectional view of a portion in which the interlayer crack 21 occurs. As illustrated in FIG. 6, the interlayer crack 21 occurs in the vicinity of the silicon-based substrate 1 and the GaN-based semiconductor film 2. In addition, the interlayer crack 21 occurs under the GaN-based semiconductor film 2. For this reason, in the seal ring 4 formed on the GaN-based semiconductor film 2, it is difficult to prevent the interlayer crack 21 from intruding into the element region 10. As a result, there is a possibility that the interlayer crack 21 intrudes into the element region 10.

In contrast, in the production method for the semiconductor chip 111 according to the present embodiment, by removing the dielectric film 3 and the protective film 5 on the GaN-based semiconductor film 2, it is possible to reduce the interlayer stress between the silicon-based substrate 1 and the GaN-based semiconductor film 2. As a result, it is possible to exhibit an effect capable of reducing the surface chipping 20 or the interlayer crack 21. The effect will be described below based on FIGS. 7 and 8.

Figure 7:
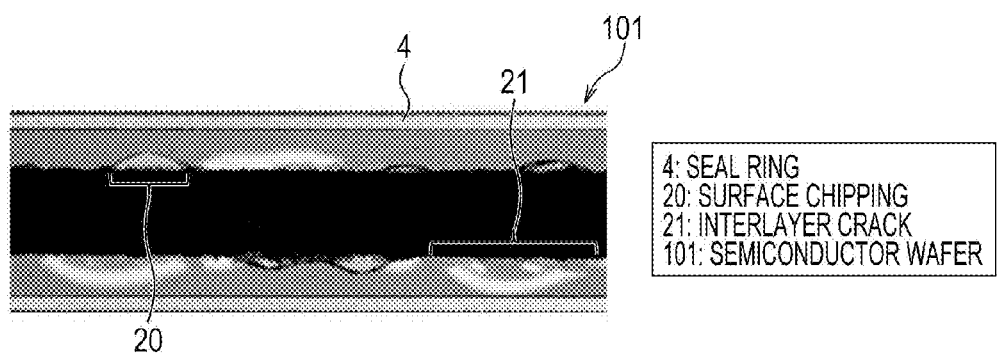
FIG. 7 is a diagram illustrating a surface state of the semiconductor wafer after dicing in the production method for the semiconductor chip according to the first embodiment.

FIG. 7 is a diagram illustrating a surface state of the semiconductor wafer 101 after dicing in the production method for the semiconductor chip 111 according to the present embodiment. It has been observed that the surface chipping 20 and the interlayer crack 21 are reduced and downscaled compared to those in FIG. 5.

Figure 8:
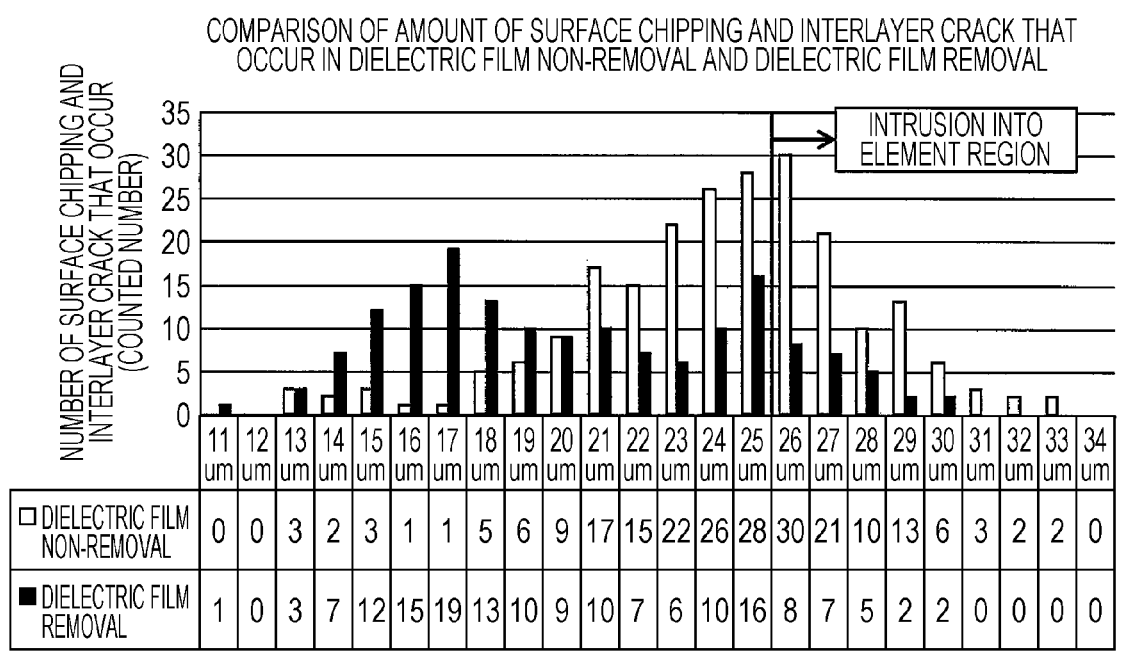
FIG. 8 is a graph illustrating a comparison of the production method for the semiconductor chip according to the first embodiment with the production method for a semiconductor chip in the related art, in respect to the amount of surface chipping and interlayer crack that occur in the semiconductor wafer after dicing.
Figure 9:
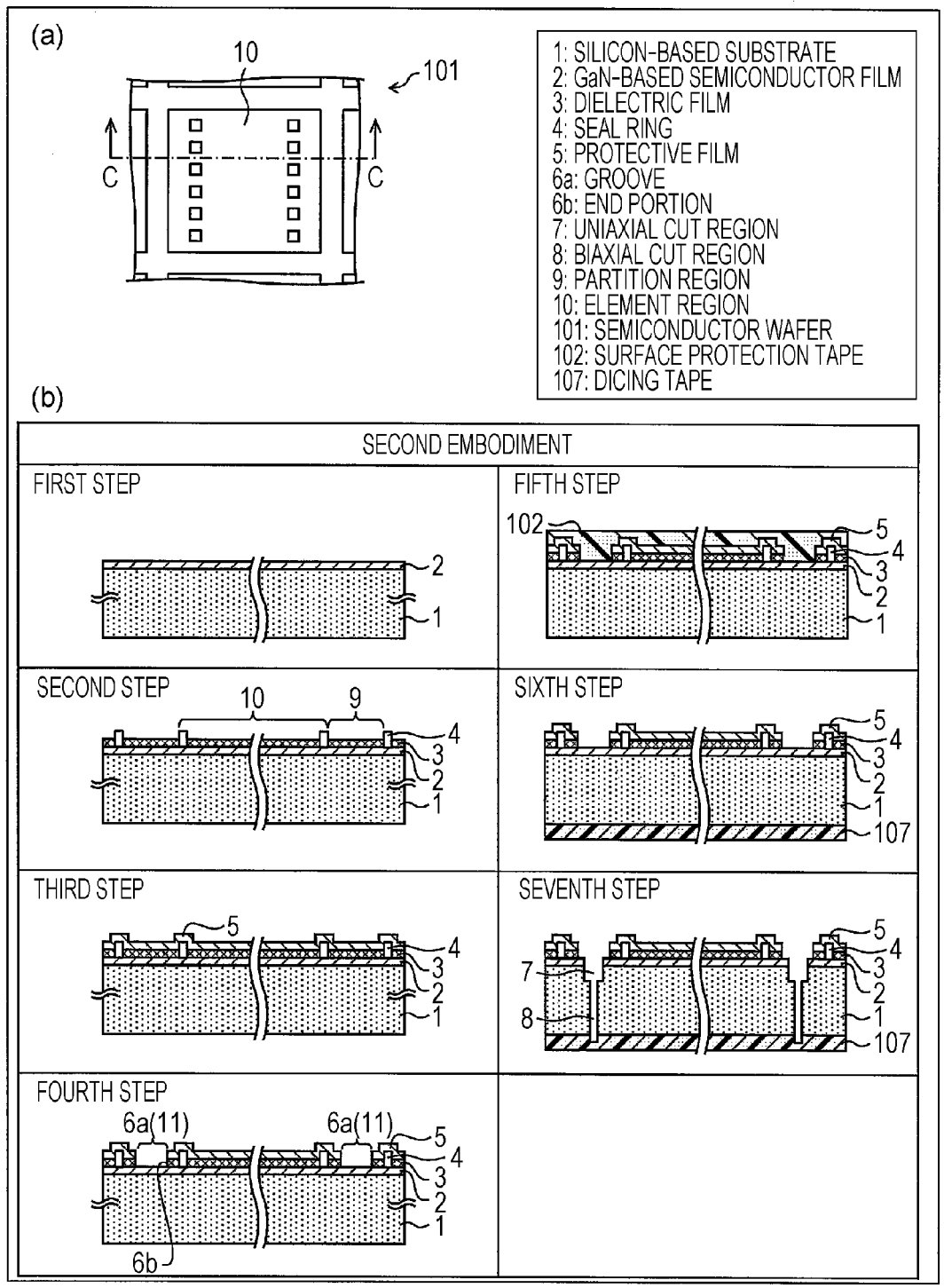
FIG. 9 is a diagram illustrating a production method for a semiconductor chip according to a second embodiment of the present invention.

FIG. 8 is a graph illustrating a comparison of the production method for the semiconductor chip 111 according to the present embodiment and the production method for a semiconductor chip in the related art, in respect to amount of the surface chipping 20 and the interlayer crack 21 that occur in the semiconductor wafer 101 after dicing. In FIG. 8, dielectric film non-removal represents the production method for a semiconductor chip in the related art, dielectric film removal represents the production method for the semiconductor chip 111 according to the present embodiment. An X axis represents the width (distance from the side of the groove) with which the surface chipping 20 and interlayer crack 21 that occur extend toward the inside of the element region 10 from the side of the groove, and a Y axis represents the number of the surface chipping 20 and the interlayer crack 21 that occur.

As illustrated in FIG. 8, the number of the surface chipping 20 and the interlayer crack 21 that occur in the production method for the semiconductor chip 111 according to the present embodiment, is reduced, compared to the production method for a semiconductor element in the related art. In addition, the width with which the surface chipping 20 and interlayer crack 21 extend toward the inside of the element region 10 from the side of the groove also decreases, and the surface chipping 20 and the interlayer crack 21 that intrude into the element region 10 decrease as well. As a result, it is also possible to suppress the number of film peeling that occurs by the surface chipping.

As illustrated in FIGS. 7 and 8, it is to be understood that the production method for the semiconductor chip 111 according to the present embodiment can reduce the surface chipping 20 and the interlayer crack 21.

As described above, according to the production method for the semiconductor chip 111 of the present embodiment, it is possible to reduce the surface chipping 20 or the interlayer crack 21. Therefore, it is possible to improve the yield of the semiconductor chip 111, and suppress the production costs compared to the production method for a semiconductor chip in the related art.

[Second Embodiment]

The production method for the semiconductor chip 111 according to the second embodiment of the present invention will be described based on FIGS. 9 to 12. For convenience of description, the same reference numerals are given to the member having a same function as that of the member described in the first embodiment, and the description thereof is not repeated.

The second embodiment is different from the first embodiment in terms of the following points.

In the first embodiment, when the groove 6 is formed in the fourth step, all of the dielectric film 3 and the protective film 5 in the partition region 9 are removed. In contrast, in the second embodiment, the dielectric film 3 and the protective film 5 in the partition region 9 are partially removed. In other words, in the second embodiment, the dicing region 11 is formed in a state where the dielectric film 3 and the protective film 5 remain at both of the side portions of the partition region 9 (refer to FIG. 9(b)).

According to the configuration, it is possible to further reduce the surface chipping 20, the interlayer crack 21, and the film peeling that occur during the dicing, compared to the first embodiment, that is, the production method for the semiconductor chip 111 by which the dicing region 11 is formed without remaining the dielectric film 3 at both of the side portions of the partition region 9. Details thereof will be described below.

(Semiconductor Wafer 101 in Each of Production Steps of Semiconductor Chip 111)

First, the semiconductor wafer 101 in each of the production steps of the semiconductor chip 111 will be described based on FIGS. 9(a) and 9(b). FIGS. 9(a) and 9(b) are diagrams illustrating the production method for the semiconductor chip 111 according to the present embodiment. More specifically, FIG. 9(a) is an enlarged plan view of a portion of the semiconductor wafer 101, and FIG. 9(b) are sectional views taken along line C-C of the semiconductor wafer 101 illustrated in FIG. 9(a) in each of the production steps of the semiconductor chip 111. The steps of the first step to third step and the fifth step to the seventh step are the same as those of the first embodiment.

In the fourth step (dicing region forming step), the dielectric film 3 and the protective film 5 in the partition region 9 are removed by etching, a groove 6a, that is, the dicing region 11 is formed. At this time, the groove 6a is formed in a state where the dielectric film 3 and the protective film 5 remain within a range of a certain distance from the seal ring 4 in the partition region 9. More specifically, in the semiconductor wafer 101, a mask (not illustrated) is placed at the element region 10 and within the range of a certain distance from the seal ring 4 in the partition region 9. Then, etching (for example, wet etching) is performed so as to remove the dielectric film 3 and the protective film 5. At this time, corrosion in the element region 10 and the partition region 9 at which the mask is placed is suppressed. As a result, the element region 10 and the range of the partition region 9 remain, and the dielectric film 3 and the protective film 5 in the partition region 9 at which the mask is not placed are removed, thereby forming the groove 6a, that is, the dicing region 11. In other words, the dicing region 11 is formed in a state where the dielectric film 3 and the protective film 5 remain at both of the side portions of the partition region 9.

According to the configuration, it is possible to further reduce the surface chipping 20, the interlayer crack 21, and the film peeling that occur during dicing, compared to the first embodiment. The widths of the partition region 9, the groove 6a, and the like are appropriately set, but in the present embodiment, the width of the partition region 9 is set to 90 µm, the width with which the dielectric film 3 remains in the partition region 9 from the seal ring 4 is set to 15 µm, and the width of the groove 6a is set to 60 µm.

(Surface Chipping and Interlayer Crack)

Next, differences in the surface chipping 20 and the interlayer crack 21 that occur after dicing will be described based on FIGS. 10 to 12, in the production method for the semiconductor chip 111 according to the present embodiment and the production method for the semiconductor chip 111 according to the first embodiment.

Figure 10:
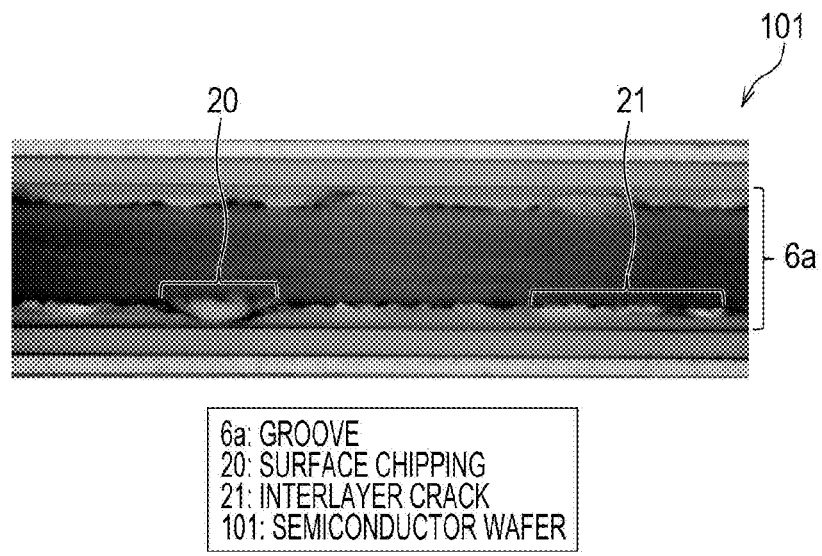
FIG. 10 is a diagram illustrating a surface state of the semiconductor wafer after dicing in the production method for the semiconductor chip according to the second embodiment.
Figure 11:
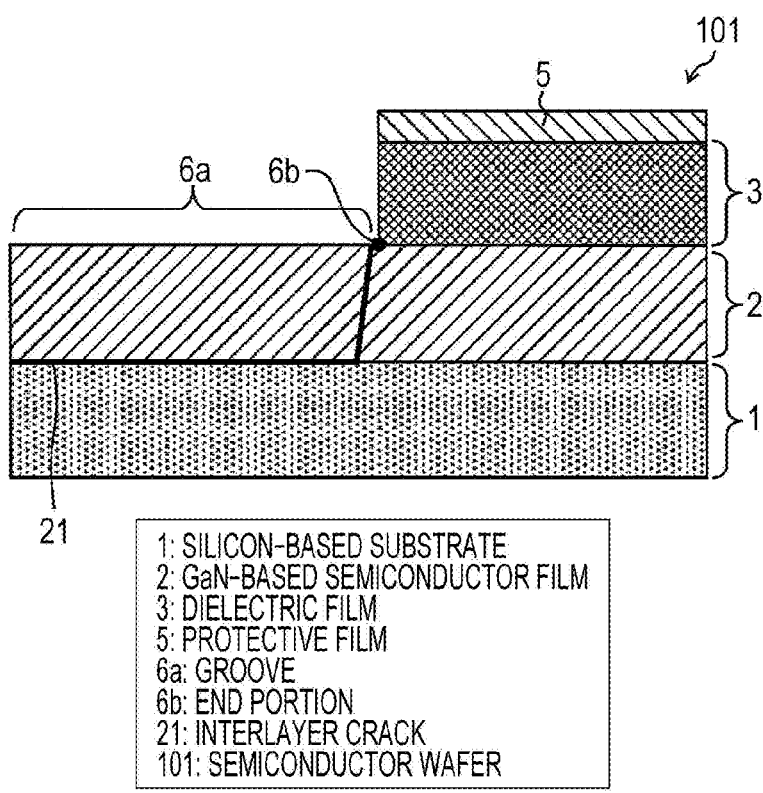
FIG. 11 is a sectional view illustrating a state of the semiconductor wafer after dicing by the production method for the semiconductor chip according to the second embodiment.

FIG. 10 is a diagram illustrating a surface state of the semiconductor wafer 101 after dicing in production method for the semiconductor chip 111 according to the present embodiment. In the production method for the semiconductor chip 111 according to the first embodiment, although the number of the surface chipping 20 or the interlayer crack 21 that occurs in the semiconductor wafer 101 can be reduced, compared to the production method for a semiconductor chip in the related art, it is difficult to prevent the surface chipping 20 or the interlayer crack 21 from contacting with the seal ring 4, and from intruding into the element region 10.

However, in the present embodiment, as illustrated in FIG. 10, the surface chipping 20 and the interlayer crack 21 are accommodated within the range of the groove 6a from which the dielectric film 3 is removed. In addition, even when the surface state of the semiconductor wafer 101 after dicing according to the present embodiment illustrated in FIG. 10 is compared to the surface state of the semiconductor wafer 101 after dicing in the production method for the semiconductor chip 111 according to the first embodiment illustrated in FIG. 7, in the present embodiment, the sizes of the surface chipping 20 and the interlayer crack 21 decrease. Therefore, it can be said that the semiconductor wafer 101 according to the present embodiment is in a good state. The reason why the semiconductor wafer 101 according to the present embodiment is in a good state will be described below.

In the present embodiment, in the fourth step, the dielectric film 3 formed on GaN-based semiconductor film 2 remains at both of the side portions of the partition region 9. Accordingly, the GaN-based semiconductor film 2 at both of the side portions of the partition region 9 is covered with the dielectric film 3. In contrast, the GaN-based semiconductor film 2 placed in the groove 6a from which the dielectric film 3 is removed is not covered with the dielectric film 3. For this reason, stress that occurs in the dicing region 11 is not directed toward the interface between the GaN-based semiconductor film 2 covered with the dielectric film 3 and the silicon-based substrate 1, and is transmitted upward (the protective film 5 side) in the front of the element region 10. Accordingly, as illustrated in FIG. 11, the interlayer crack 21 that occurs by dicing the dicing regions 11 progresses upward in a direction of the end portion 6b of the groove 6a, before the interlayer crack 21 intrudes into the element region 10. FIG. 11 is a sectional view illustrating a state of the semiconductor wafer 101 after dicing by the production method for the semiconductor chip 111 according to the second embodiment.

As described above, when the groove 6a is formed, by remaining the dielectric film 3 at both of the side portions of the partition region 9, it is possible to suppress intrusion of the interlayer crack 21 into the interface in the element region 10 between the GaN-based semiconductor film 2 and the silicon-based substrate 1. In addition, the surface of the GaN-based semiconductor film 2 at both of the side portions of the partition region 9 is covered with the dielectric film 3, and thus it is possible to suppress the intrusion of the surface chipping 20 into the element region 10. Therefore, the state of the semiconductor wafer 101 after dicing becomes good.

Figure 12:
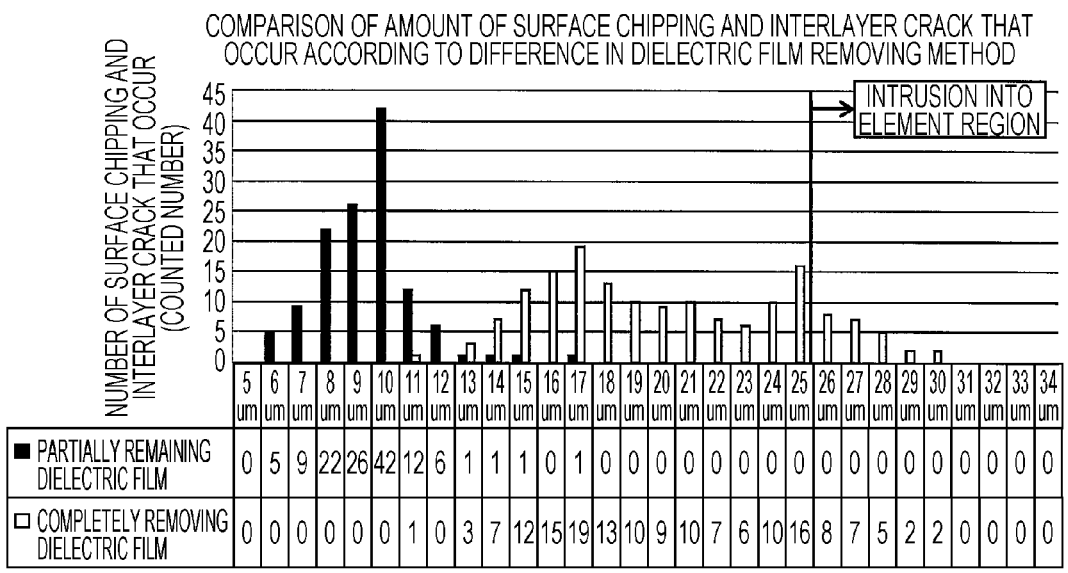
FIG. 12 is a graph illustrating a comparison of the production method for the semiconductor chip according to the first embodiment and the production method for the semiconductor chip according to the second embodiment, in respect to the amount of surface chipping and interlayer crack that occur in the semiconductor wafer after dicing.

FIG. 12 is a graph illustrating a comparison of the production method for the semiconductor chip 111 according to the present embodiment, with the production method for the semiconductor chip 111 according to the first embodiment, in respect to the amount of the surface chipping 20 and the interlayer crack 21 that occur in semiconductor wafer 101 after dicing. In FIG. 12, completely removing dielectric film represents the production method for the semiconductor chip 111 according to the first embodiment, and partially remaining dielectric film represents the production method for the semiconductor chip 111 according to the present embodiment. An X axis represents the width (distance from the side of the groove) with which the surface chipping 20 and interlayer crack 21 that occur extend toward the inside of the element region 10 from the side of the groove, and a Y axis represents the number of the surface chipping 20 and the interlayer crack 21 that occur.

According to the production method for the semiconductor chip 111 of the present embodiment, as illustrated in FIG. 12, the number of the surface chipping 20 and the interlayer crack 21 that occur further decrease, compared to the production method for the semiconductor chip 111 according to the first embodiment, and the widths with which the surface chipping 20 and interlayer crack 21 extend toward the inside from the side of the groove further decrease. In addition, instances of the surface chipping 20 and the interlayer crack 21 being in contact with the seal ring 4 or intruding into the seal ring 4 are absent.

As described above, according to the production method for the semiconductor chip 111 of the present embodiment, it is possible to reduce the surface chipping 20 or the interlayer crack 21, thereby improving the yield of the semiconductor chip 111 and further improving the productivity of the semiconductor chip 111 compared to the production method for the semiconductor chip 111 according to the first embodiment.

[Outline]

The production method for the semiconductor element (semiconductor chip 111) according to a first aspect of the present invention includes a semiconductor element forming step of forming the plurality of the semiconductor elements (element regions 10) by forming the dielectric film (3) on the GaN-based semiconductor film (2) formed on the substrate (silicon-based substrate 1), a dicing region forming step (fourth step) of forming the groove-shaped dicing regions (11) by removing the dielectric film in the partition regions (9) that partition the plurality of the semiconductor elements, and a dicing step (seventh step) of separating the plurality of the semiconductor elements from each other by dicing the dicing regions.

According to the configuration, the dielectric film is partitioned into the plurality of the semiconductor elements by the dicing regions, and thus it is possible to separate the plurality of the semiconductor elements (semiconductor chips) from each other by dicing the dicing regions. In addition, dicing is performed after removing the dielectric film in the dicing region, and thus it is possible to reduce the interlayer crack, the surface chipping, and the film peeling that occur in the vicinity of the interface between the substrate and the GaN-based semiconductor film during dicing. Therefore, the interlayer crack or the like can be reduced without using laser dicing, and thus it is possible to suppress the production cost of the semiconductor element. Further, the interlayer crack or the like can be reduced without dry etching the GaN-based semiconductor film, and thus it is possible to shorten the production time of the semiconductor element. As a result, it is possible to improve the yield and the productivity in production for the semiconductor element.

In the production method for the semiconductor element (semiconductor chip 111) according to a second aspect of the present invention, in the first aspect, the dielectric film (3) may remain at both of the side portions of the partition region (9) in the dicing region forming step (fourth step).

According to the configuration, the dicing region is formed in a state where the dielectric film remains at both of the side portions of the partition region. Therefore, it is possible to further reduce the crack, the surface chipping, and the film peeling that occur in the vicinity of the interface between the substrate and the GaN-based semiconductor film during dicing, compared to a case where the dicing region is formed without remaining the dielectric film at both of the side portions of the partition region.

In the production method for the semiconductor element (semiconductor chip 111) according to a third aspect of the present invention, in the first or second aspect, the dicing blade (110) may be used in the dicing step (seventh step).

According to the configuration, by dicing the substrate using the dicing blade instead of laser dicing, it is possible to suppress the production cost of the semiconductor element.

In the production method for the semiconductor element (semiconductor chip 111) according to a fourth aspect of the present invention, in the third aspect, the dicing blade (110) may include at least a uniaxial rotary blade that cuts the GaN-based semiconductor film (2) and a biaxial rotary blade that cuts the substrate (silicon based substrate 1), and the dicing may be performed by the step cut method in the dicing step (seventh step).

According to the configuration, the dicing blade includes a uniaxial rotary blade that cuts the GaN-based semiconductor film and a biaxial rotary blade that cuts the substrate, and the semiconductor wafer is cut using the dicing blade by the step cut method. Therefore, it is possible to reduce the load of the blade, compared to the full cut method for cutting the semiconductor wafer by one time. In addition, it is possible to further reduce the crack, the surface chipping, and the film peeling that occur in the vicinity of the interface between the substrate and the GaN-based semiconductor film during dicing the semiconductor wafer, compared to the full cut method.

The semiconductor element (semiconductor chip 111) according to a fifth aspect of the present invention is a semiconductor element that is separated from the semiconductor wafer (101) including the GaN-based semiconductor film (2) formed on the substrate (silicon based substrate 1) and the dielectric film (3) formed on the GaN-based semiconductor film. The semiconductor element is separated from the semiconductor wafer by dicing dicing regions (11) from which the dielectric film is removed.

According to the configuration, it is possible to exhibit the same effects as those of the first aspect.

The present invention is not limited to each of the above-described embodiments, and can be freely modified in various ways within a scope described in the claims. Also, an embodiment obtained by appropriately combining each technical means disclosed in different embodiments falls within a technical scope of the present invention. Furthermore, by combining technical means disclosed in each embodiment, it is possible to form a new technical feature.

INDUSTRIAL APPLICABILITY

The production method for the semiconductor element according to the present invention can be appropriately used in the semiconductor element production field.

REFERENCE SIGNS LIST

1 SILICON-BASED SUBSTRATE (SUBSTRATE)
2 GaN-BASED SEMICONDUCTOR FILM
3 DIELECTRIC FILM
4 SEAL RING
5 PROTECTIVE FILM
6 GROOVE
6a GROOVE
6b END PORTION

7 UNIAXIAL CUT REGION
8 BIAXIAL CUT REGION
9 PARTITION REGION
10 ELEMENT REGION (SEMICONDUCTOR ELEMENT)
11 DICING REGION
20 SURFACE CHIPPING
21 INTERLAYER CRACK
101 SEMICONDUCTOR WAFER
102 SURFACE PROTECTION TAPE
110 DICING BLADE
111 SEMICONDUCTOR CHIP (SEMICONDUCTOR ELEMENT)

The invention claimed is:

1. A production method for a semiconductor element comprising:
    a semiconductor element forming step of forming a plurality of semiconductor elements by forming a dielectric film on a GaN-based semiconductor film formed on a substrate;
    a dicing region forming step of forming groove-shaped dicing regions by using etching to remove the dielectric film in partition regions that partition the plurality of semiconductor elements; and
    a dicing step of separating the plurality of semiconductor elements from each other by dicing the dicing regions.

2. The production method for a semiconductor element according to claim 1,
    wherein the dielectric film remains at the both side portions of the partition region in the dicing region forming step.

3. The production method for a semiconductor element according to claim 1
    wherein a dicing blade is used in the dicing step.

4. The production method for a semiconductor element according to claim 3,
    wherein the dicing blade includes at least a uniaxial rotary blade that cuts the GaN-based semiconductor film and a biaxial rotary blade that cuts the substrate, and
    wherein the dicing is performed by a step cut method in the dicing step.

5. The production method for a semiconductor element according to claim 1, wherein in the dicing region forming step, masking is performed on regions other than the partition regions, and the dielectric film in the partition regions is removed by use of wet etching.

* * * * *